United States Patent
Lei et al.

(10) Patent No.: US 9,721,839 B2
(45) Date of Patent: *Aug. 1, 2017

(54) ETCH-RESISTANT WATER SOLUBLE MASK FOR HYBRID WAFER DICING USING LASER SCRIBING AND PLASMA ETCH

(71) Applicant: Applied Materials, Inc., Santa Clara, CA (US)

(72) Inventors: Wei-Sheng Lei, San Jose, CA (US); Mohammad Kamruzzaman Chowdhury, Santa Clara, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/738,389

(22) Filed: Jun. 12, 2015

(65) Prior Publication Data

US 2016/0365283 A1    Dec. 15, 2016

(51) Int. Cl.
*H01L 21/02*      (2006.01)
*H01L 21/82*      (2006.01)
(Continued)

(52) U.S. Cl.
CPC ........ *H01L 21/82* (2013.01); *H01J 37/32889* (2013.01); *H01J 37/32899* (2013.01);
(Continued)

(58) Field of Classification Search
CPC ... H01L 21/78; H01L 21/268; H01L 21/3065; H01L 21/02; H01L 21/02076;
(Continued)

(56) References Cited

U.S. PATENT DOCUMENTS 4,049,944 A    9/1977    Garvin et al.
4,339,528 A    7/1982    Goldman
(Continued)

FOREIGN PATENT DOCUMENTS

JP    9216085    8/1997
JP    10321908    12/1998
(Continued)

OTHER PUBLICATIONS

Linder, V. et al., "Water-Soluble Sacrificial Layers for Surface Micromachining," www.small-journal.com, 2005, 1, No. 7, 7 pgs.
(Continued)

*Primary Examiner* — Chuong A Luu
(74) *Attorney, Agent, or Firm* — Blakely Sokoloff Taylor Zafman LLP (57) ABSTRACT

Methods of dicing semiconductor wafers, each wafer having a plurality of integrated circuits, are described. In an example, a method of dicing a semiconductor wafer including a plurality of integrated circuits includes forming a water soluble mask above the semiconductor wafer, the water soluble mask covering and protecting the integrated circuits. The method also includes baking the water soluble mask to increase the etch resistance of the water soluble mask. The method also includes, subsequent to baking the water soluble mask, patterning the water soluble mask with a laser scribing process to provide a water soluble patterned mask with gaps, exposing regions of the semiconductor wafer between the integrated circuits. The method also includes plasma etching the semiconductor wafer through the gaps in the water soluble patterned mask to singulate the integrated circuits.

22 Claims, 8 Drawing Sheets

(51) Int. Cl.
*H01L 21/3065* (2006.01)
*H01L 21/308* (2006.01)
*H01L 21/67* (2006.01)
*H01J 37/32* (2006.01)

(52) U.S. Cl.
CPC .... *H01L 21/02076* (2013.01); *H01L 21/3065* (2013.01); *H01L 21/3081* (2013.01); *H01L 21/3086* (2013.01); *H01L 21/67207* (2013.01); *H01J 2237/334* (2013.01); *H01J 2237/335* (2013.01)

(58) Field of Classification Search
CPC . H01L 21/82; H01L 21/3081; H01L 21/3086; H01L 21/67207
USPC ............................................... 438/462
See application file for complete search history.

(56) References Cited

U.S. PATENT DOCUMENTS

| | | | |
|---|---|---|---|
| 4,684,437 | A | 8/1987 | Donelon et al. |
| 5,336,638 | A | 8/1994 | Suzuki et al. |
| 5,593,606 | A | 1/1997 | Owen et al. |
| 5,691,794 | A | 11/1997 | Hoshi et al. |
| 6,051,503 | A | 4/2000 | Bhardwaj et al. |
| 6,057,180 | A | 5/2000 | Sun et al. |
| 6,174,271 | B1 | 1/2001 | Kosmowski |
| 6,300,593 | B1 | 10/2001 | Powell |
| 6,306,731 | B1 | 10/2001 | Igarashi et al. |
| 6,407,363 | B2 | 6/2002 | Dunsky et al. |
| 6,426,275 | B1 | 7/2002 | Arisa |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,361,990 | B2 | 4/2008 | Lu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,638 | B2 | 3/2009 | Mancini et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,804,043 | B2 | 9/2010 | Deshi |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,926,410 | B2 | 4/2011 | Bair |
| 7,927,973 | B2 | 4/2011 | Haji et al. |
| 8,623,739 | B2 * | 1/2014 | Lee .................. G03F 7/40 438/400 |
| 8,912,075 | B1 * | 12/2014 | Lei .................. H01L 21/6836 257/620 |
| 8,975,163 | B1 * | 3/2015 | Lei .................. H01L 21/78 257/E21.602 |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2004/0157457 | A1 | 8/2004 | Xu et al. |
| 2004/0212047 | A1 | 10/2004 | Joshi et al. |
| 2006/0043535 | A1 | 3/2006 | Hiatt |
| 2006/0086898 | A1 | 4/2006 | Cheng et al. |
| 2006/0088984 | A1 | 4/2006 | Li et al. |
| 2006/0146910 | A1 | 7/2006 | Koochesfahani et al. |
| 2006/0205182 | A1 | 9/2006 | Soejima |
| 2009/0255911 | A1 | 10/2009 | Krishnaswami et al. |
| 2010/0013036 | A1 | 1/2010 | Carey |
| 2010/0216313 | A1 | 8/2010 | Iwai et al. |
| 2010/0248451 | A1 | 9/2010 | Pirogovsky et al. |
| 2011/0014777 | A1 | 1/2011 | Haji et al. |
| 2011/0312157 | A1 | 12/2011 | Lei et al. |
| 2012/0322233 | A1 | 12/2012 | Lei et al. |
| 2013/0045554 | A1 | 2/2013 | Yamazaki |
| 2013/0065378 | A1 | 3/2013 | Johnson et al. |
| 2013/0230972 | A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

* cited by examiner

ETCH-RESISTANT WATER SOLUBLE MASK FOR HYBRID WAFER DICING USING LASER SCRIBING AND PLASMA ETCH

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of, and apparatuses for, dicing semiconductor wafers.

In an embodiment, a method of dicing a semiconductor wafer including a plurality of integrated circuits includes forming a water soluble mask above the semiconductor wafer, the water soluble mask covering and protecting the integrated circuits. The method also includes baking the water soluble mask to increase the etch resistance of the water soluble mask. The method also includes, subsequent to baking the water soluble mask, patterning the water soluble mask with a laser scribing process to provide a water soluble patterned mask with gaps, exposing regions of the semiconductor wafer between the integrated circuits. The method also includes plasma etching the semiconductor wafer through the gaps in the water soluble patterned mask to singulate the integrated circuits.

In another embodiment, a method of dicing a semiconductor wafer including a plurality of integrated circuits includes forming a pre-patterned water soluble mask above the semiconductor wafer. The pre-patterned water soluble mask covers and protects the integrated circuits and has gaps exposing regions of the semiconductor wafer between the integrated circuits. The method also includes baking the pre-patterned water soluble mask to increase the etch resistance of the pre-patterned water soluble mask. The method also includes, subsequent to baking the pre-patterned water soluble mask, plasma etching the semiconductor wafer through the gaps in the pre-patterned water soluble mask to singulate the integrated circuits.

In another embodiment, a system for dicing a semiconductor wafer including a plurality of integrated circuits includes a factory interface. The system also includes a laser scribe apparatus coupled with the factory interface and including a laser assembly. The system also includes a cluster tool coupled with the laser scribe apparatus. The cluster tool includes a plasma etch chamber. The cluster tool also includes a deposition and bake chamber configured to deposit and bake a water soluble mask.

DETAILED DESCRIPTION

Methods of dicing semiconductor wafers, each wafer having a plurality of integrated circuits thereon, are described. In the following description, numerous specific details are set forth, such as water soluble mask materials and treatments, laser scribing conditions, and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. More specifically, one or more embodiments are directed to implementing an etch-resistant water soluble mask for, e.g., dicing applications.

Embodiments described herein are directed to approaches for mask formation and removal for use in laser scribing and plasma etching hybrid wafer dicing processes. In one embodiment, implementation of approaches described herein can increase an etch resistance of a water soluble mask.

To provide context, spin coating of a water soluble mask material layer provides a mask having a typical mask-to-Si etch selectivity of approximately 1:20 for a water soluble mask with regular viscosity, and can be as los as 1:5 for low viscosity material. As such, for a given dicing application, a certain corresponding mask thickness is needed, as a portion of the mask is removed in the silicon etching portion of the dicing process. However, for the initial laser scribe process, a thick mask demands more laser pulse energy to scribe through, and typically at an overall lower scribing speed.

To provide further context, for wafers with high density bumps or pillars, it is very difficult to achieve coating thickness uniformity across the wafer and from wafer to wafer. As such, for a given laser scribe process, a laser ablation opened trench may have different kerf width across the wafer, depending on the localized coating thickness. The result may be varied critical dimension (CD) for plasma etch, which has a different corresponding etch rate, leading to non-uniform etch processing.

In accordance with one or more embodiments described herein, addressing one or more of the above issues, a relatively thin, but high etch resistant water soluble mask coating is provided. Such an etch resistant water soluble mask can be implemented to reduce wafer level and wafer to wafer coating thickness variation, and to reduce a required laser pulse energy for scribing. In one embodiment, a water soluble mask is first applied on a water via spin coating. The water soluble mask is then baked at a relatively high temperature, e.g., approximately in the range of 50 to 130 degrees Celsius. It is to be appreciated that such higher temperature baking may cause crosslinking of water soluble mask material, significantly increasing etch resistance during a silicon etch. For example, in a particular embodiment, a water soluble mask material is baked at approximately 130 degrees Celsius for approximately 3 minutes. The coated wafer is then laser scribed and etched. Through a Si etch process involving 86 cycles of a Bosch etch process, almost no mask consumption was observed.

Figure 1:
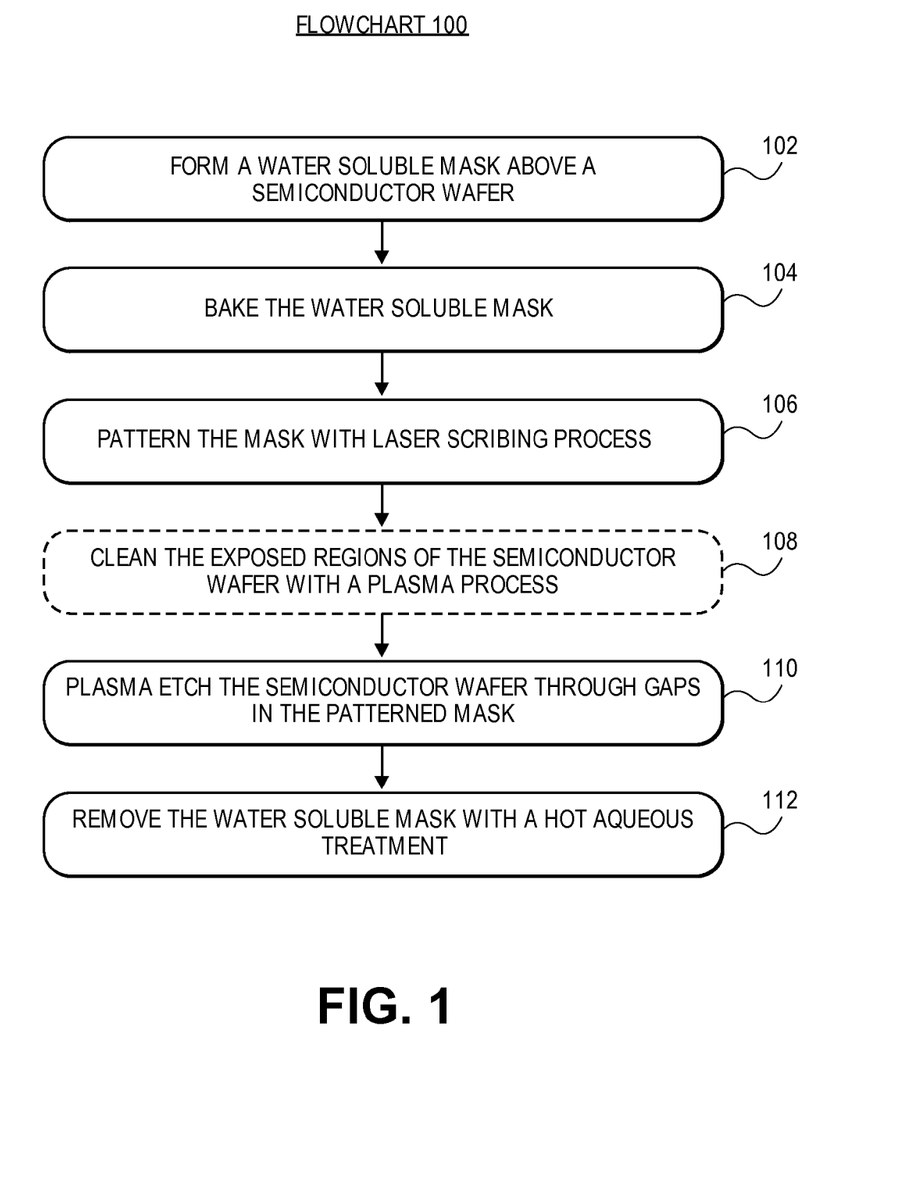
FIG. 1 is a Flowchart representing operations in a method of dicing a semiconductor wafer including a plurality of integrated circuits, in accordance with an embodiment of the present invention.
Figure 2A:
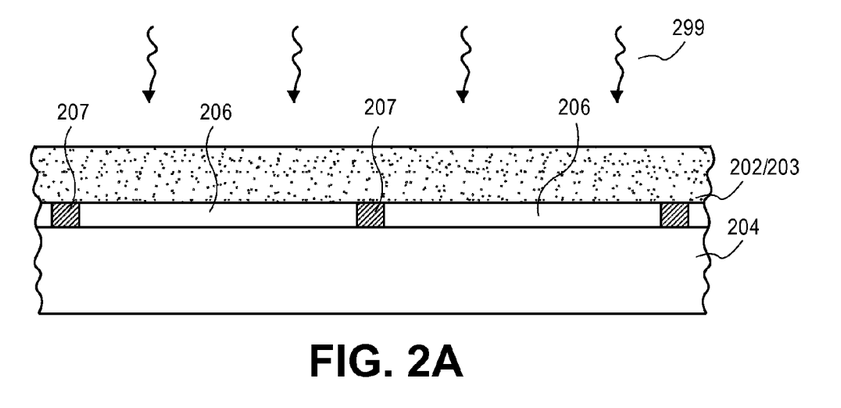
FIG. 2A illustrates a cross-sectional view of a semiconductor wafer including a plurality of integrated circuits during performing of a method of dicing the semiconductor wafer, corresponding to operations 102 and 104 of the Flowchart of FIG. 1, in accordance with an embodiment of the present invention.
Figure 2B:
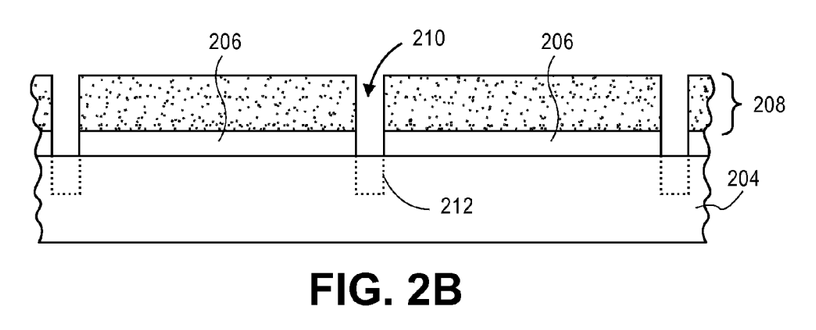
FIG. 2B illustrates a cross-sectional view of a semiconductor wafer including a plurality of integrated circuits during performing of a method of dicing the semiconductor wafer, corresponding to operation 106 of the Flowchart of FIG. 1, in accordance with an embodiment of the present invention.
Figure 2C:
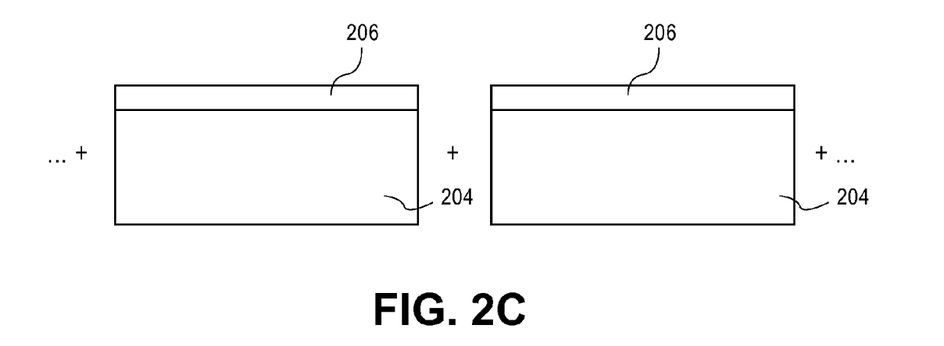
FIG. 2C illustrates a cross-sectional view of a semiconductor wafer including a plurality of integrated circuits during performing of a method of dicing the semiconductor wafer, corresponding to operations 110 and 112 of the Flowchart of FIG. 1, in accordance with an embodiment of the present invention.

As such, in an aspect of the present invention, an etch-resistant water soluble mask is used for a singulation process based on a combination of a laser scribing process with a plasma etching process to dice a semiconductor wafer into singulated integrated circuits. FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention. To show the breadth of applicability of embodiments described herein, a dicing process that does not necessarily rely on laser scribing of a mask material is described below in association with FIG. 3.

Referring to operation 102 of Flowchart 100, and corresponding FIG. 2A, a water soluble mask 202 is formed above a semiconductor wafer or substrate 204. The water soluble mask 202 covers and protects integrated circuits 206 formed on the surface of semiconductor wafer 204. The water soluble mask 202 also covers intervening streets 207 formed between each of the integrated circuits 206.

In an embodiment, as deposited, the water-soluble mask 202 is readily dissolvable in an aqueous media. For example, in one embodiment, the as deposited water-soluble mask 202 is composed of a material that is soluble in one or more of an alkaline solution, an acidic solution, or in deionized water. In one embodiment, the as deposited water-soluble mask 202 is composed of a material such as, but not limited to, polyvinyl alcohol, polyacrylic acid, dextran, polymethacrylic acid, polyethylene imine, or polyethylene oxide. In a specific embodiment, the as-deposited water-soluble mask 202 has an etch rate in an aqueous solution approximately in the range of 1-15 microns per minute and, more particularly, approximately 1.3 microns per minute. In an embodiment, the as deposited water-soluble mask 202 is deposited using a spin-coating process.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Referring now to operation 104 of Flowchart 100, and again to corresponding FIG. 2A, the water soluble mask 202 is baked. In an embodiment, the water soluble mask 202 is baked 299 to increase the etch resistance of the water soluble mask, providing etch resistant water soluble mask 203. In a specific embodiment, the water soluble mask 202 is baked 299 at a relatively high temperature approximately in the range of 50 to 130 degrees Celsius. Such higher temperature baking causes crosslink of the water soluble mask 202 so as to significantly increase etch resistance. For example, when the water soluble mask 202 mask is baked at or near 130 degrees Celsius for approximately 3 minutes, the resulting etch resistant water soluble mask 203 is robust against a silicon etch process. Specifically, in the case of E30-polyvilnyl alcohol (PVA with a viscosity of approximately 1500 centPoise) spin-coated with oscillation at 300 rpm, cured at approximately 125 degrees Celsius for 3 minutes, 60% Power, 30 kHz, 30 mm/sec, almost no consumption of the baked mask was observed after 86 Bosch Cycles.

More generally, it is to be appreciated that a higher baking temperature corresponds to a shorter baking time and can be optimized. In one embodiment, baking is performed using a hot plate technique or a heat (light) radiation applied from the wafer front side (e.g., non-tape mounted side in the case of the use of a substrate carrier) or other suitable techniques.

Referring to operation 106 of Flowchart 100, and corresponding FIG. 2B, the etch resistant water soluble mask 203 is patterned with a laser scribing process to provide a etch resistant water soluble patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present invention, patterning the etch resistant water soluble mask 203 with the laser scribing process includes forming trenches 212 partially into the regions of the semiconductor wafer 204 between the integrated circuits 206, as depicted in FIG. 2B.

In an embodiment, a femtosecond-based laser is used as a source for a laser scribing process. For example, in an embodiment, a laser with a wavelength in the visible spectrum plus the ultra-violet (UV) and infra-red (IR) ranges (totaling a broadband optical spectrum) is used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the etch resistant water soluble mask 203, the streets 207 and, possibly, a portion of the semiconductor wafer or substrate 204.

It is to be appreciated that by using a laser beam profile with contributions from the femtosecond range, heat damage issues are mitigated or eliminated versus longer pulse widths (e.g., nanosecond processing). The elimination or mitigation of damage during laser scribing may be due to a lack of low energy recoupling or thermal equilibrium. It is also to be appreciated that laser parameter selection, such as beam profile, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 4 illustrates a cross-sectional view of a stack of materials that may be used in a street region of a semiconductor wafer or substrate, in accordance with an embodiment of the present invention.

Figure 4:
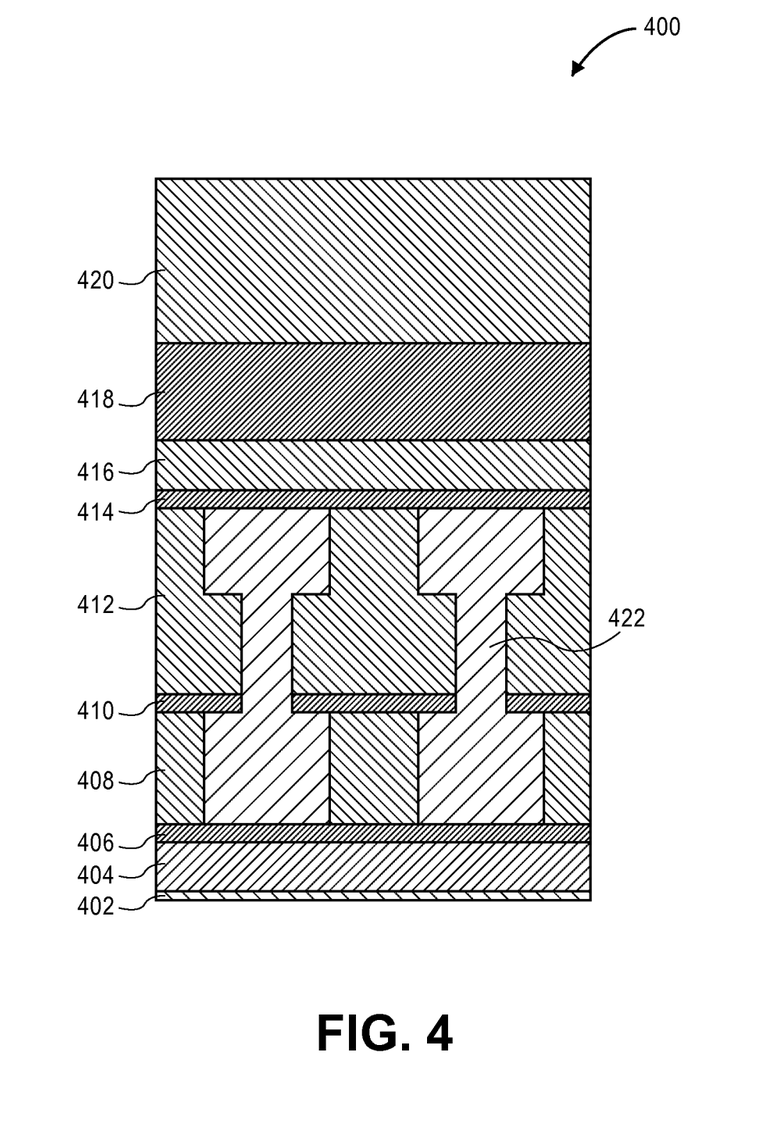
FIG. 4 illustrates a cross-sectional view of a stack of materials that may be used in a street region of a semiconductor wafer or substrate, in accordance with an embodiment of the present invention.

Referring to FIG. 4, a street region 400 includes the top portion 402 of a silicon substrate, a first silicon dioxide layer 404, a first etch stop layer 406, a first low K dielectric layer 408 (e.g., having a dielectric constant of less than the dielectric constant of 4.0 for silicon dioxide), a second etch stop layer 410, a second low K dielectric layer 412, a third etch stop layer 414, an undoped silica glass (USG) layer 416, a second silicon dioxide layer 418, and a etch resistant water soluble mask 420. Copper metallization 422 is disposed between the first and third etch stop layers 406 and 414 and through the second etch stop layer 410. In a specific embodiment, the first, second and third etch stop layers 406, 410 and 414 are composed of silicon nitride, while low K dielectric layers 408 and 412 are composed of a carbon-doped silicon oxide material.

Under conventional laser irradiation (such as nanosecond-based irradiation), the materials of street 400 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nano-second-based irradiation. In an embodiment, a femto-second based laser scribing process is used to pattern a layer of silicon dioxide, a layer of low K material, and a layer of copper by ablating the layer of silicon dioxide prior to ablating the layer of low K material and the layer of copper.

In case that the laser beam it is a femtosecond-based laser beam, in an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. In an embodiment, a line shaped profile laser beam laser scribing process is suitable to provide such advantages.

It is to be appreciated that the dicing or singulation process could be stopped after the above described laser scribing in a case that the laser scribing is used to pattern the mask as well as to scribe fully through the wafer or substrate in order to singulate the dies. Accordingly, further singulation processing would not be required in such a case. However, the following embodiments may be considered in cases where laser scribing alone is not implemented for total singulation.

Referring now to optional operation 108 of Flowchart 100, an intermediate post mask-opening cleaning operation is performed. In an embodiment, the post mask-opening cleaning operation is a plasma-based cleaning process. In an example, as described below, the plasma-based cleaning process is non-reactive to the regions of the substrate 204 exposed by the gaps 210.

In accordance with one embodiment, the plasma-based cleaning process is non-reactive to exposed regions of the substrate 204 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks such as etch resistant water soluble mask 203. In another such embodiment, separate mask condensation and scribed trench cleaning operations are used, e.g., an Ar or non-reactive gas (or the mix) highly-biased plasma treatment for mask condensation is first performed, and then an Ar+$SF_6$ plasma cleaning of a laser scribed trench is performed. This embodiment may be suitable for cases where Ar-cleaning is not sufficient for trench cleaning due to too thick of a mask material.

Referring to operation 110 of Flowchart 100, and corresponding FIG. 2C, the semiconductor wafer 204 is etched through the gaps 210 in the patterned mask 208 to singulate the integrated circuits 206. In accordance with an embodiment of the present invention, etching the semiconductor wafer 204 includes ultimately etching entirely through semiconductor wafer 204, as depicted in FIG. 2C, by etching the trenches 212 initially formed with the line shaped profile laser beam laser scribing process.

In an embodiment, patterning the etch resistant water soluble mask 203 with the laser scribing process involves forming trenches in the regions of the semiconductor wafer between the integrated circuits, and plasma etching the semiconductor wafer involves extending the trenches to form corresponding trench extensions. In one such embodiment, each of the trenches has a width, and each of the corresponding trench extensions has the width.

In accordance with an embodiment of the present invention, the resulting roughness of etch resistant water soluble mask 203 opening from laser scribing can impact die sidewall quality resulting from the subsequent formation of a plasma etched trench. Lithographically opened masks often have smooth profiles, leading to smooth corresponding sidewalls of a plasma etched trench. By contrast, a conventional laser opened mask can have a very rough profile along a scribing direction if improper laser process parameters are selected (such as spot overlap, leading to rough sidewall of plasma etched trench horizontally). Although the surface roughness can be smoothened by additional plasma processes, there is a cost and throughput hit to remedying such issues. Accordingly, embodiments described herein may be advantageous in providing a smoother scribing process from the laser scribing portion of the singulation process.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura®

Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the etch resistant water soluble patterned mask 208 is removed after the singulation process, as depicted in FIG. 2C, and as is described in greater detail below. In another embodiment, the plasma etching operation described in association with FIG. 2C employs a conventional Bosch-type dep/etch/dep process to etch through the substrate 204. Generally, a Bosch-type process consists of three sub-operations: deposition, a directional bombardment etch, and isotropic chemical etch which is run through many iterations (cycles) until silicon is etched through.

Referring to operation 112 of Flowchart 100, and again to corresponding FIG. 2C, the etch resistant water soluble patterned mask 208 is removed. In an embodiment, the etch resistant water soluble patterned mask 208 is removed by a hot aqueous treatment, such as a hot water treatment. In an embodiment, the etch resistant water soluble patterned mask 208 is removed under stronger conditions than would otherwise be required if the initial water soluble mask 202 was not baked. For example, for the PVA example provided above, in the absence of a preliminary bake operation, the material may be removed in a water treatment for 5 minutes at room temperature. However, in the case of the etch resistant water soluble patterned mask 208, such a treatment may not be sufficient for full material removal. By contrast, in an embodiment, the etch resistant water soluble patterned mask 208 is removed in a hot water treatment at a temperature approximately in the range of 40-100 degrees Celsius. In a specific embodiment, the etch resistant water soluble patterned mask 208 is removed in a hot water treatment at a temperature approximately in the range of 80-90 degrees Celsius. It is to be appreciated that the hotter the temperature of the water, the less time may be needed for the hot water treatment.

It is to be appreciated that other circumstances may benefit from a lower water treatment temperature. For example, in the case that a wafer for dicing is supported on a dicing tape that may be impacted by a higher temperature water treatment (e.g., through loss of adhesion), a relatively lower water treatment temperature may be employed, albeit for a longer duration that a relatively higher water treatment temperature. In one such embodiment, the water treatment is above room temperature (i.e., the water is heated), but below a temperature of approximately 40 degrees Celsius. In a specific such embodiment, the etch resistant water soluble patterned mask 208 is removed in a warm water treatment at a temperature approximately in the range of 35-40 degrees Celsius.

Accordingly, referring again to Flowchart 100 and FIGS. 2A-2C, wafer dicing may be preformed by initial ablation to ablate through an etch resistant water soluble mask 203, through wafer streets (including metallization), and partially into a silicon substrate. Die singulation may then be completed by subsequent through-silicon deep plasma etching. A specific example of a materials stack for dicing is described below in association with FIGS. 5A-5D, in accordance with an embodiment of the present invention.

Figure 5A:
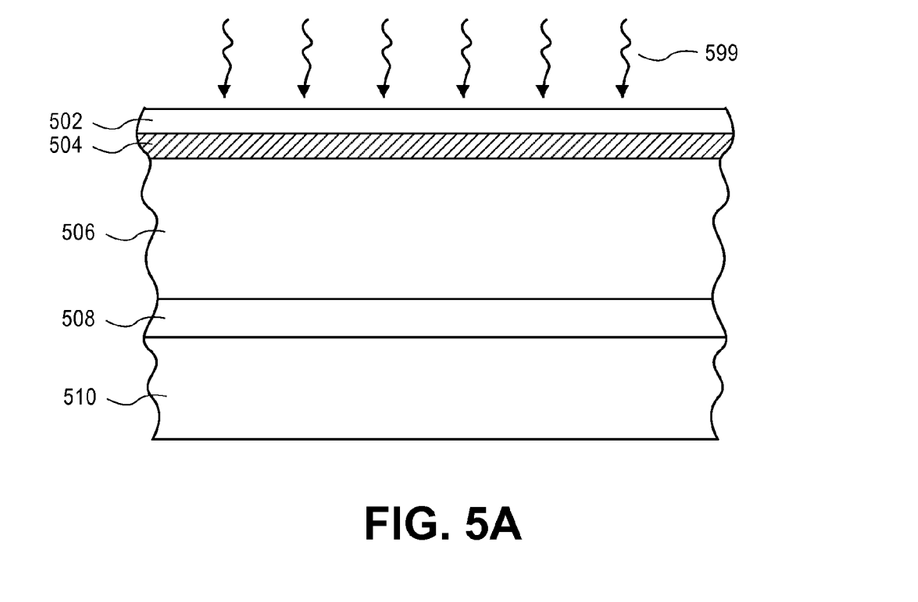
FIGS. 5A-5D illustrate cross-sectional views of various operations in a method of dicing a semiconductor wafer, in accordance with an embodiment of the present invention.

Referring to FIG. 5A, a materials stack for hybrid laser ablation and plasma etch dicing includes an etch resistant water soluble mask 502, a device layer 504, and a substrate 506. The etch resistant water soluble mask layer 502, device layer 504, and substrate 506 are disposed above a die attach film 508 which is affixed to a backing tape 510. In an embodiment, the etch resistant water soluble mask 502 is one such as described above in association with etch resistant water soluble mask 203. The device layer 504 includes an inorganic dielectric layer (such as silicon dioxide) disposed above one or more metal layers (such as copper layers) and one or more low K dielectric layers (such as carbon-doped oxide layers). The device layer 504 also includes streets arranged between integrated circuits, the streets including the same or similar layers to the integrated circuits. The substrate 506 is a bulk single-crystalline silicon substrate. In an embodiment, the etch resistant water soluble mask 502 is fabricated using a thermal treatment 599, such as described above for etch resistant water soluble mask layer 203.

In an embodiment, the bulk single-crystalline silicon substrate 506 is thinned from the backside prior to being affixed to the die attach film 508. The thinning may be performed by a backside grind process. In one embodiment, the bulk single-crystalline silicon substrate 506 is thinned to a thickness approximately in the range of 50-100 microns. It is important to note that, in an embodiment, the thinning is performed prior to a laser ablation and plasma etch dicing process. In an embodiment, the etch resistant water soluble mask 502 has a thickness of approximately 5 microns and the device layer 504 has a thickness approximately in the range of 2-3 microns. In an embodiment, the die attach film 508 (or any suitable substitute capable of bonding a thinned or thin wafer or substrate to the backing tape 510) has a thickness of approximately 20 microns.

Figure 5B:
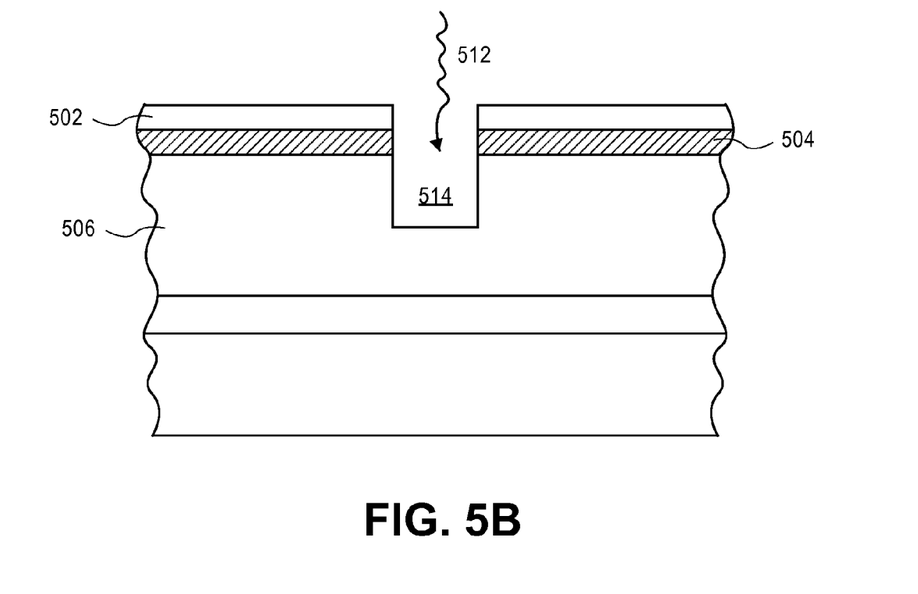
Figure 5C:
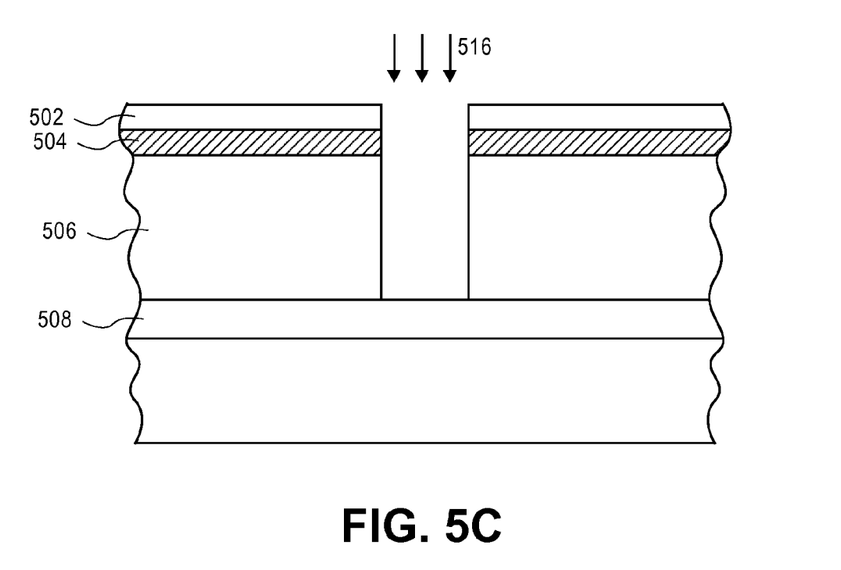

Referring to FIG. 5B, the etch resistant water soluble mask 502, the device layer 504 and a portion of the substrate 506 are patterned with a laser beam laser scribing process 512 to form trenches 514 in the substrate 506. Referring to FIG. 5C, a through-silicon deep plasma etch process 516 is used to extend the trench 514 down to the die attach film 508, exposing the top portion of the die attach film 508 and singulating the silicon substrate 506. The device layer 504 is protected by the etch resistant water soluble mask 502 during the through-silicon deep plasma etch process 516.

Figure 5D:
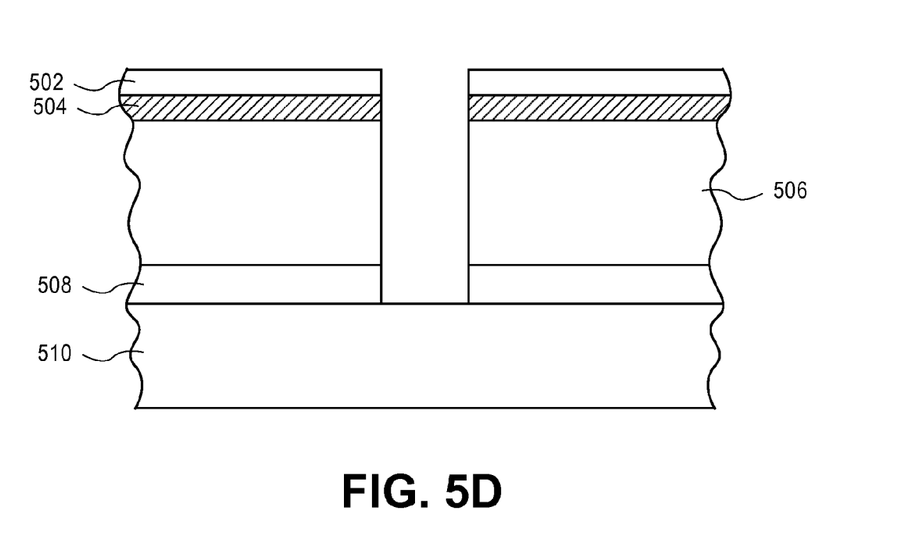

Referring to FIG. 5D, the singulation process may further include patterning the die attach film 508, exposing the top portion of the backing tape 510 and singulating the die attach film 508. In an embodiment, the die attach film is singulated by a laser process or by an etch process. Further embodiments may include subsequently removing the singulated portions of substrate 506 (e.g., as individual integrated circuits) from the backing tape 510. In one embodiment, the singulated die attach film 508 is retained on the back sides of the singulated portions of substrate 506. In an alternative embodiment, in the case that substrate 506 is thinner than approximately 50 microns, the laser beam laser scribing process 512 is used to completely singulate substrate 506 without the use of an additional plasma process. Embodiments may further include removing the etch resistant water soluble mask 502 from the device layer 504. Removal of the etch resistant water soluble mask 502 can be as described above for removal of the etch resistant water soluble patterned mask 208.

Figure 3:
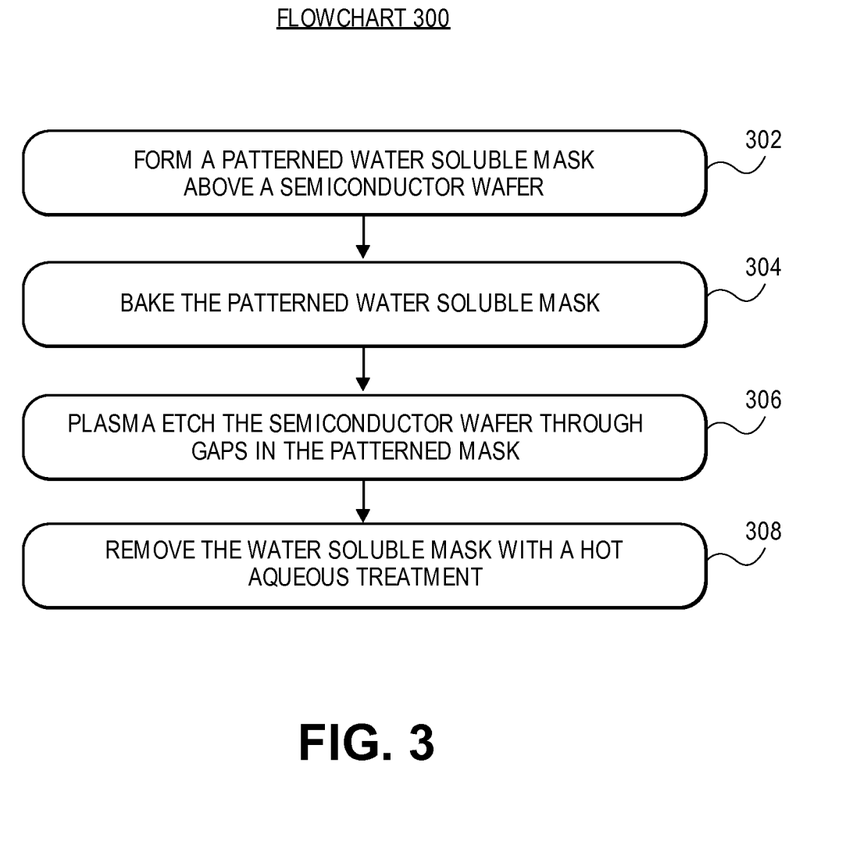
FIG. 3 is a Flowchart representing operations in another method of dicing a semiconductor wafer including a plurality of integrated circuits, in accordance with another embodiment of the present invention.

As mentioned briefly above, it may be the case that an approach need not involve laser scribing of an etch resistant water soluble mask in order for implementations described herein to be advantageous for a dicing process. As an example, FIG. 3 is a Flowchart 300 representing operations in another method of dicing a semiconductor wafer including a plurality of integrated circuits, in accordance with another embodiment of the present invention.

Referring to operation 302 of Flowchart 300, a method of dicing a semiconductor wafer including a plurality of integrated circuits includes forming a patterned water soluble mask above the semiconductor wafer. In one such embodiment, the patterned water soluble mask is a pre-patterned water soluble mask. For example, in one embodiment, the pre-patterned water soluble mask is formed on the wafer by a process such as a screen print or jet print process that provides the water soluble mask material in an already patterned formed upon deposition. In one such embodiment the pattern of the pre-patterned water soluble mask covers and protects the integrated circuits and has gaps exposing regions of the semiconductor wafer between the integrated circuits.

Referring to operation 304 of Flowchart 300, the method of dicing a semiconductor wafer including a plurality of integrated circuits also includes baking the pre-patterned water soluble mask to increase the etch resistance of the pre-patterned water soluble mask, as described above in association with Flowchart 100. In an embodiment, baking the pre-patterned water soluble mask involves heating the pre-patterned water soluble mask to a temperature approximately in the range of 50-130 degrees Celsius. In a particular embodiment, the pre-patterned water soluble mask is a pre-patterned polyvinyl alcohol (PVA) mask having a viscosity of approximately 1500 centipoise, and baking the pre-patterned water soluble mask involves heating the pre-patterned PVA mask to a temperature of approximately 125 degrees Celsius for a duration of approximately 3 minutes.

Referring to operation 306 of Flowchart 300, the method of dicing a semiconductor wafer including a plurality of integrated circuits also includes, subsequent to baking the pre-patterned water soluble mask, plasma etching the semiconductor wafer through the gaps in the pre-patterned water soluble mask to singulate the integrated circuits.

Referring to operation 308 of Flowchart 300, in an embodiment, the method of dicing a semiconductor wafer including a plurality of integrated circuits also includes, subsequent to plasma etching the semiconductor wafer, removing the pre-patterned water soluble mask using water. In one such embodiment, the pre-patterned water soluble mask is removed using water at a temperature approximately in the range of 40-100 degrees Celsius. In a particular embodiment, the pre-patterned water soluble mask is a pre-patterned polyvinyl alcohol (PVA) mask having a viscosity of approximately 1500 centipoise, baking the pre-patterned water soluble mask involves heating the pre-patterned PVA mask to a temperature of approximately 125 degrees Celsius for a duration of approximately 3 minutes, and the pre-patterned PVA mask is removed using water at a temperature approximately in the range of 80-90 degrees Celsius.

Although in the process of Flowchart 300 a laser scribe operation is not used to pattern the mask material, it is to be appreciated that a laser scribing operation can still be implemented with such a pre-patterned mask. For example, in an embodiment, the laser scribing process is used to remove street materials that are otherwise difficult to remove in a silicon etch process. In an embodiment, then, the method of Flowchart 300 further includes, prior to plasma etching the semiconductor wafer, forming trenches through the gaps in the pre-patterned water soluble using a laser scribing process. The trenches are located in the regions of the semiconductor wafer between the integrated circuits. In one such embodiment, plasma etching the semiconductor wafer involves extending the trenches to form corresponding trench extensions. In an embodiment, subsequent to forming the trenches through the gaps in the pre-patterned water soluble using the laser scribing process, and prior to plasma etching the semiconductor wafer, the trenches of the semiconductor wafer are cleaned with a plasma process.

A single process tool may be configured to perform many or all of the operations in a hybrid laser beam ablation and plasma etch singulation process utilizing an etch resistant water soluble mask. For example, FIG. 6 illustrates a block diagram of a tool layout for laser and plasma dicing of wafers or substrates, in accordance with an embodiment of the present invention.

Figure 6:
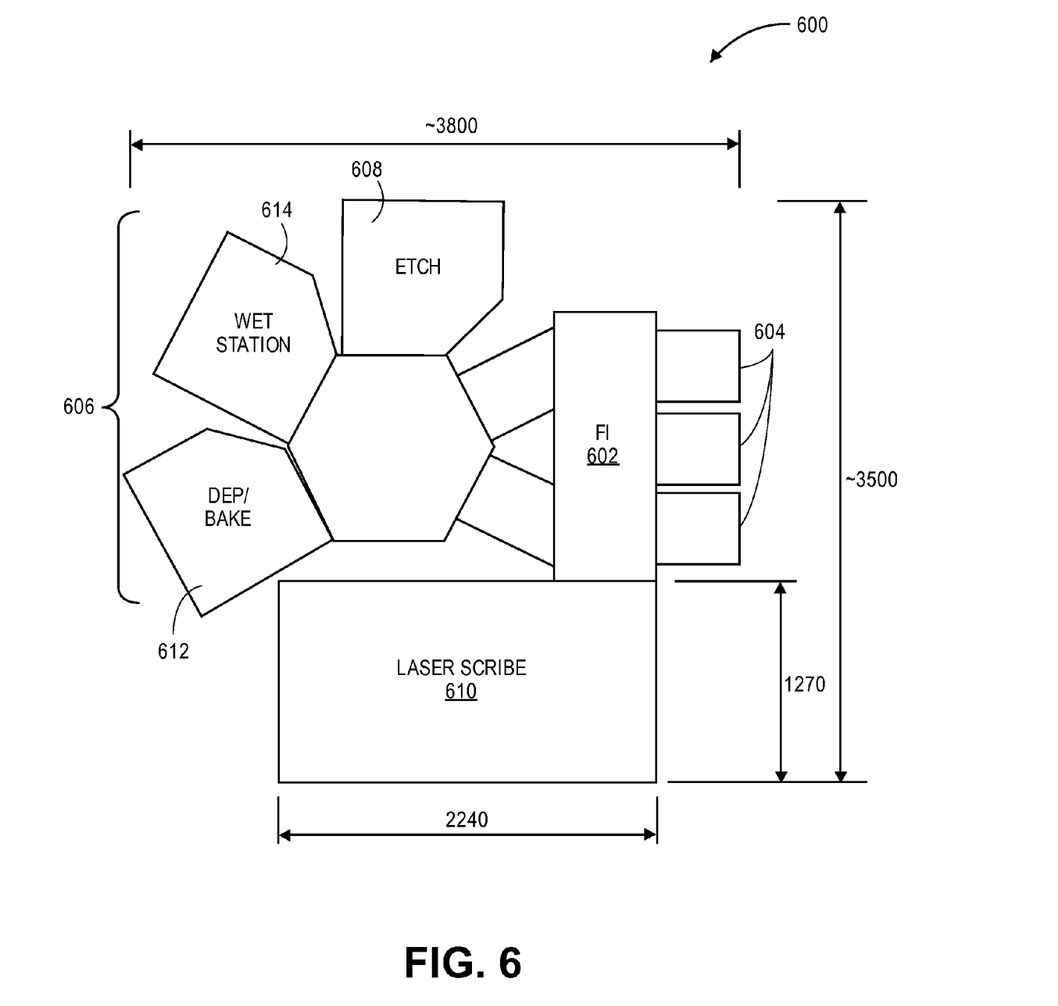
FIG. 6 illustrates a block diagram of a tool layout for laser and plasma dicing of wafers or substrates, in accordance with an embodiment of the present invention.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a laser assembly configured to provide a femto-second based laser beam. In an embodiment, the laser is suitable for performing a laser ablation portion of a hybrid laser and etch singulation process, such as the laser ablation processes described above. In one embodiment, a moveable stage is also included in laser scribe apparatus 610, the moveable stage configured for moving a wafer or substrate (or a carrier thereof) relative to the laser. In a specific embodiment, the laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 is configured for etching a wafer or substrate through the gaps in a patterned mask to singulate a plurality of integrated circuits. In one such embodiment, the one or more plasma etch chambers 608 is configured to perform a deep silicon etch process. In a specific embodiment, the one or more plasma etch chambers 608 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both.

Cluster tool 606 may include other chambers suitable for performing functions in a method of singulation. For example, in one embodiment, a deposition and/or bake chamber 612 is included. The deposition and/or bake chamber 612 may be configured for water soluble mask deposition on or above a device layer of a wafer or substrate prior to laser scribing of the wafer or substrate. Such a water soluble mask material may be baked prior to the dicing process, as is described above. In an embodiment, a wet station 614 is included. The wet station may be suitable for cleaning performing a hot aqueous treatment for removing an etch resistant water soluble mask, as is described above, subsequent to a laser scribe and plasma etch singulation process of a substrate or wafer. In an embodiment, although not depicted, a metrology station is also included as a component of process tool 600.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
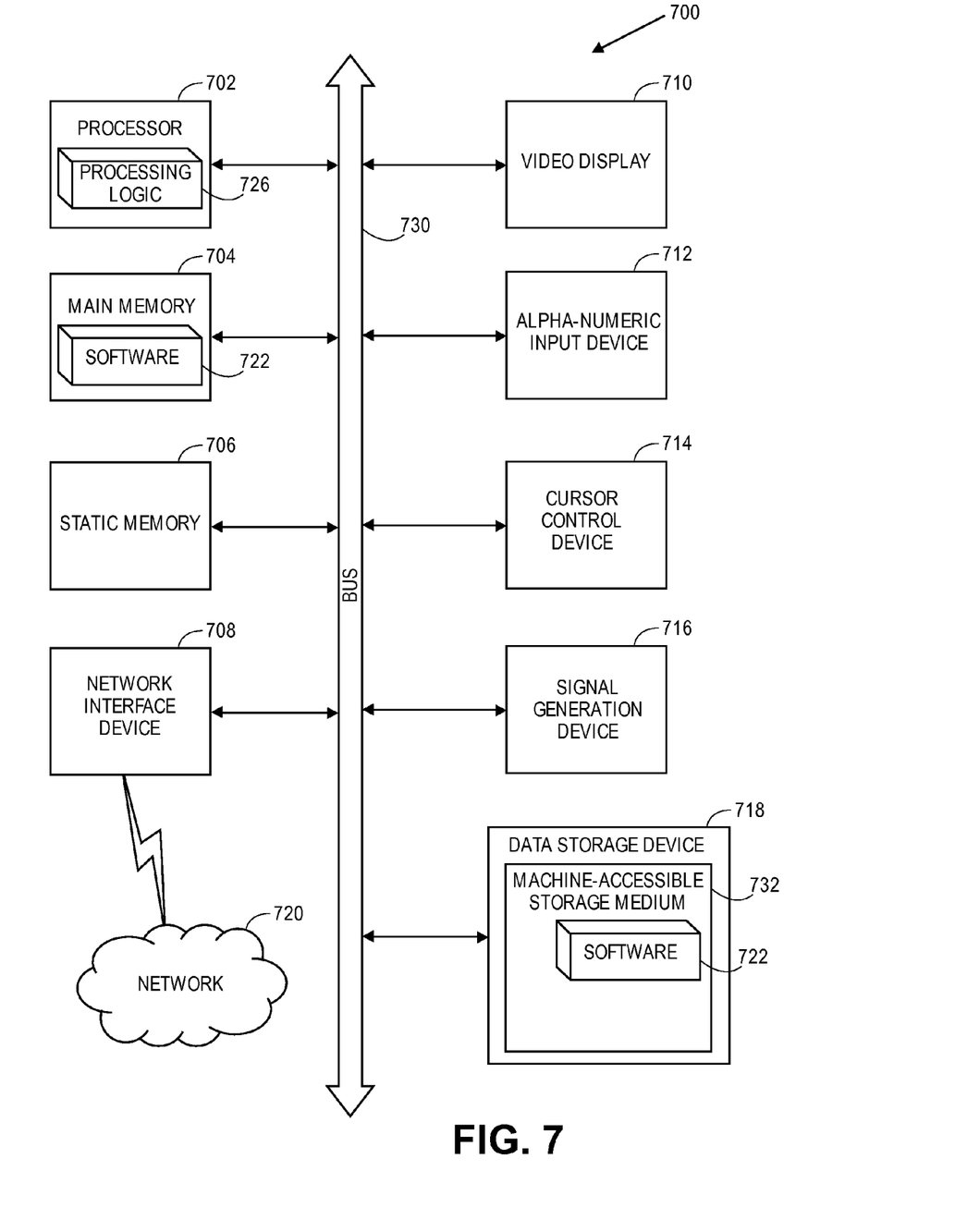
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a water soluble mask above the semiconductor wafer, the water soluble mask covering and protecting the integrated circuits. The method also includes baking the water soluble mask to increase the etch resistance of the water soluble mask. The method also includes, subsequent to baking the water soluble mask, patterning the water soluble mask with a laser scribing process to provide a water soluble patterned mask with gaps, exposing regions of the semiconductor wafer between the integrated circuits. The method also includes plasma etching the semiconductor wafer through the gaps in the water soluble patterned mask to singulate the integrated circuits.

Thus, hybrid wafer dicing approaches using a laser scribing process and plasma etch process implementing an etch-resistant water soluble mask have been disclosed.

What is claimed is:

1. A method of dicing a semiconductor wafer comprising a plurality of integrated circuits, the method comprising:
   forming a water soluble mask above the semiconductor wafer, the water soluble mask covering and protecting the integrated circuits;
   subsequent to forming the water soluble mask, baking the water soluble mask to increase the etch resistance of the water soluble mask;
   subsequent to baking the water soluble mask, patterning the water soluble mask with a laser scribing process to provide a water soluble patterned mask with gaps, exposing regions of the semiconductor wafer between the integrated circuits; and
   plasma etching the semiconductor wafer through the gaps in the water soluble patterned mask to singulate the integrated circuits.

2. The method of claim 1, wherein baking the water soluble mask comprises heating the water soluble mask to a temperature approximately in the range of 50-130 degrees Celsius.

3. The method of claim 1, further comprising:
   subsequent to plasma etching the semiconductor wafer, removing the water soluble patterned mask using water at a temperature approximately in the range of 40-100 degrees Celsius.

4. The method of claim 1, wherein forming the water soluble mask comprises forming a polyvinyl alcohol (PVA) mask having a viscosity of approximately 1500 centipoise, and wherein baking the water soluble mask comprises heating the PVA mask to a temperature of approximately 125 degrees Celsius for a duration of approximately 3 minutes.

5. The method of claim 4, further comprising:
   subsequent to plasma etching the semiconductor wafer, removing the PVA patterned mask using water at a temperature approximately in the range of 80-90 degrees Celsius.

6. The method of claim 1, further comprising:
   subsequent to patterning the water soluble mask with the laser scribing process and prior to plasma etching the semiconductor wafer through the gaps, cleaning the exposed regions of the semiconductor wafer with a plasma process.

7. The method of claim 1, wherein patterning the water soluble mask with the laser scribing process comprises forming trenches in the regions of the semiconductor wafer between the integrated circuits, and wherein plasma etching the semiconductor wafer comprises extending the trenches to form corresponding trench extensions.

8. A method of dicing a semiconductor wafer comprising a plurality of integrated circuits, the method comprising:
   forming a pre-patterned water soluble mask above the semiconductor wafer, the pre-patterned water soluble mask covering and protecting the integrated circuits and having gaps exposing regions of the semiconductor wafer between the integrated circuits;
   subsequent to forming the pre-patterned water soluble mask, baking the pre-patterned water soluble mask to increase the etch resistance of the pre-patterned water soluble mask; and
   subsequent to baking the pre-patterned water soluble mask, plasma etching the semiconductor wafer through the gaps in the pre-patterned water soluble mask to singulate the integrated circuits.

9. The method of claim 8, wherein baking the pre-patterned water soluble mask comprises heating the pre-patterned water soluble mask to a temperature approximately in the range of 50-130 degrees Celsius.

10. The method of claim 8, further comprising:
    subsequent to plasma etching the semiconductor wafer, removing the pre-patterned water soluble mask using water at a temperature approximately in the range of 40-100 degrees Celsius.

11. The method of claim 8, wherein forming the pre-patterned water soluble mask comprises forming a pre-patterned polyvinyl alcohol (PVA) mask having a viscosity of approximately 1500 centipoise, and wherein baking the pre-patterned water soluble mask comprises heating the pre-patterned PVA mask to a temperature of approximately 125 degrees Celsius for a duration of approximately 3 minutes.

12. The method of claim 11, further comprising:
    subsequent to plasma etching the semiconductor wafer, removing the pre-patterned PVA mask using water at a temperature approximately in the range of 80-90 degrees Celsius.

13. The method of claim 8, further comprising:
    prior to plasma etching the semiconductor wafer, forming trenches through the gaps in the pre-patterned water soluble using a laser scribing process, the trenches located in the regions of the semiconductor wafer between the integrated circuits.

14. The method of claim 13, wherein plasma etching the semiconductor wafer comprises extending the trenches to form corresponding trench extensions.

15. The method of claim 13, further comprising:
    subsequent to forming the trenches through the gaps in the pre-patterned water soluble using the laser scribing process and prior to plasma etching the semiconductor wafer, cleaning the trenches of the semiconductor wafer with a plasma process.

16. A method of dicing a semiconductor wafer comprising a plurality of integrated circuits, the method comprising:
    providing a semiconductor wafer having a water soluble mask thereon, the water soluble mask covering and protecting the integrated circuits;
    subsequent to providing the semiconductor wafer having the water soluble mask thereon, baking the semiconductor wafer and the water soluble mask to increase the etch resistance of the water soluble mask;
    subsequent to the baking, patterning the water soluble mask with a laser scribing process to provide a water soluble patterned mask with gaps, exposing regions of the semiconductor wafer between the integrated circuits; and
    plasma etching the semiconductor wafer through the gaps in the water soluble patterned mask to singulate the integrated circuits.

17. The method of claim 16, wherein baking the semiconductor wafer and the water soluble mask comprises heating the semiconductor wafer and the water soluble mask to a temperature approximately in the range of 50-130 degrees Celsius.

18. The method of claim 16, further comprising:
subsequent to plasma etching the semiconductor wafer, removing the water soluble patterned mask using water at a temperature approximately in the range of 40-100 degrees Celsius.

19. The method of claim 16, wherein, prior to the baking, the water soluble mask comprises a polyvinyl alcohol (PVA) mask having a viscosity of approximately 1500 centipoise, and wherein baking the semiconductor wafer and the water soluble mask comprises heating the PVA mask to a temperature of approximately 125 degrees Celsius for a duration of approximately 3 minutes.

20. The method of claim 19, further comprising:
subsequent to plasma etching the semiconductor wafer, removing the PVA patterned mask using water at a temperature approximately in the range of 80-90 degrees Celsius.

21. The method of claim 16, further comprising:
subsequent to patterning the water soluble mask with the laser scribing process and prior to plasma etching the semiconductor wafer through the gaps, cleaning the exposed regions of the semiconductor wafer with a plasma process.

22. The method of claim 16, wherein patterning the water soluble mask with the laser scribing process comprises forming trenches in the regions of the semiconductor wafer between the integrated circuits, and wherein plasma etching the semiconductor wafer comprises extending the trenches to form corresponding trench extensions.

* * * * *